US007884597B2

(12) United States Patent  
Ostmeier

(10) Patent No.: US 7,884,597 B2
(45) Date of Patent: Feb. 8, 2011

(54) APPARATUS FOR TESTING A PROTECTIVE MEASURING OR METERING DEVICE AS A CONSTITUENT PART OF A HIGH OR MEDIUM VOLTAGE INSTALLATION, MORE SPECIFICALLY OF A UTILITY PROTECTIVE RELAY, OF A GENERATOR PROTECTIVE DEVICE, OF A CURRENT METER, OR OF OTHER PROTECTIVE, MEASURING OR METERING ELECTRICAL DEVICES IN A HIGH OR MEDIUM VOLTAGE INSTALLATION

(76) Inventor: Hubert Ostmeier, RodderbergstraBe 65, Anschrift (DE) 34130

( * ) Notice: Subject to any disclaimer, the term of this patent is extended or adjusted under 35 U.S.C. 154(b) by 0 days.

(21) Appl. No.: 12/150,405

(22) Filed: Apr. 28, 2008

(65) Prior Publication Data

US 2009/0243586 A1 Oct. 1, 2009

(30) Foreign Application Priority Data

Mar. 29, 2008 (DE) .................... 10 2008 016 388

(51) Int. Cl.
*G01R 1/00* (2006.01)
(52) U.S. Cl. ................................... 324/110
(58) Field of Classification Search ............ 324/72.5, 324/73.1, 158.1, 754; 200/51.09, 51.1; 439/188
See application file for complete search history.

(56) References Cited

U.S. PATENT DOCUMENTS

| | | | |
|---|---|---|---|
| 1,211,940 A * | 1/1917 | Harlow | 439/142 |
| 1,669,666 A * | 5/1928 | Laub | 200/51 R |
| 1,887,421 A * | 11/1932 | Newman | 200/2 |
| 3,171,708 A * | 3/1965 | Salomone | 439/724 |
| 3,538,492 A * | 11/1970 | Genovese | 439/739 |
| 3,696,296 A * | 10/1972 | Nylen | 324/754 |
| 4,023,884 A * | 5/1977 | Morlan | 439/628 |
| 4,050,045 A * | 9/1977 | Motten et al. | 337/187 |
| 4,538,879 A * | 9/1985 | Wagener | 439/211 |
| 4,761,148 A * | 8/1988 | Sappington | 439/620.26 |
| 5,630,725 A * | 5/1997 | Green et al. | 439/188 |
| 2005/0250376 A1 * | 11/2005 | Ostmeier | 439/521 |

FOREIGN PATENT DOCUMENTS

| DE | 10216013 | 10/2003 |
|---|---|---|
| DE | 102005025108 | 7/2006 |

* cited by examiner

*Primary Examiner*—Jermele M Hollington
(74) *Attorney, Agent, or Firm*—Thomas R. Vigil

(57) ABSTRACT

The subject matter of the invention is an apparatus for testing a protective, measuring or metering device as a constituent part of a high or medium voltage installation, more specifically of a utility protective relay, of a generator protective device, of a current meter and so on in a high or medium voltage installation, a combined terminal and pole block (1) located in the input field of the high or medium voltage installation being connected in the protective field to the protective, measuring or metering device, said terminal and pole block (1) comprising several terminal and pole segments (2) disposed behind each other, each terminal and pole segment (2) comprising on its upper side a pole opening (5) for receiving the pole blade (7) of a plug (8), each terminal and pole segment (2) having a cable clamping apparatus (27; 31) on either side thereof, said cable clamping apparatus (27; 31) being accessible through an opening (22a) for the cable disposed in the side wall of the terminal and pole segment (2).

10 Claims, 3 Drawing Sheets

APPARATUS FOR TESTING A PROTECTIVE MEASURING OR METERING DEVICE AS A CONSTITUENT PART OF A HIGH OR MEDIUM VOLTAGE INSTALLATION, MORE SPECIFICALLY OF A UTILITY PROTECTIVE RELAY, OF A GENERATOR PROTECTIVE DEVICE, OF A CURRENT METER, OR OF OTHER PROTECTIVE, MEASURING OR METERING ELECTRICAL DEVICES IN A HIGH OR MEDIUM VOLTAGE INSTALLATION

1. FIELD OF THE INVENTION

The present invention relates to an apparatus for testing a protective, measuring or metering device as a constituent part of a high or medium voltage installation, more specifically or a utility protective relay, of a generator protective device, of a current meter or of other protective, measuring or metering electrical devices in a high or medium voltage installation.

2. DESCRIPTION OF THE PRIOR ART

A terminal block for a current meter is known from DE 102 16 913 terminal clamp members being provided for plugging onto the current meter. This allows for exchanging a meter without interrupting the current supply by plugging a bypass plug onto the terminal block.

A high voltage installation is meant to refer e.g., to 110 kV installations in an electrical substation. With such a 110 kV installation, the current supply occurs via corresponding 110 kV lines. When one phase fails in such a 110 kV line, the line must be completely shut off. Relays, what are referred to as utility protective relays, which trigger corresponding switches that completely remove such a line from the network in the electrical substation, are appropriately used for this purpose. The working order of these relays must be checked at determined intervals. Not only such utility protective relays but also generator protective devices or also meters constitute the subject matter of the invention in their quality of protective, measuring or metering devices.

Protective, measuring or metering devices, referred to herein after as electrical devices, are connected to the high voltage line by what are termed converters or also transformers. To make testing of such electrical devices such as a utility protective relay possible, it is known to provide for redundant installations. This means that, when a test is to be carried out, a line is shut off with the installation being kept operative during the test by the second line. Erection of such redundant installations always involves very high costs, though.

Insofar, an apparatus for testing a protective, measuring or metering device of a high or medium voltage installation, e.g., of a utility protective relay in a high or medium voltage installation is known from DE 10 2005 025 108, said apparatus including a pole block for connection to the electrical device, said pole block comprising several pole openings disposed one behind the other, such a pole opening serving to receive the pole blade of a plug. The pole blade of a plug and/or at least one pole blade of an edge connector comprise thereby a coding coinciding with the associated pole opening of the pole block.

This means that, like a key and a lock, only a certain pole blade of the plug can be introduced into a certain pole opening of the pole terminal block.

Introducing plugs into the pole block finally makes it possible to readily and safely connect a checking or measuring device to the electrical device such as a utility protective relay in a high or medium voltage installation.

It is further known from prior art that such a high or medium voltage installation consists of three fields, namely a so-called input field, a protective field and an output field. In the input field there are located the series terminals for receiving the cables, said series terminals being configured so as to allow for what is termed a pull relief. This means that no substantial torque is acting onto the terminals. In the input field there are also located the tension converters and the inverters.

The input field communicates with what is termed the protective field. In the protective field there are located the electrical devices such as the utility protective relays, with utility protective relays communicating with the pole block described herein above. In this context, it has already been discussed that the pole block comprises several pole openings disposed one behind the other, said holes also serving to receive the pole blade of a plug. By introducing such type plugs, such a utility protective relay is at need switched off, meaning bypassed, or the plug serves for connecting a checking or measuring device.

The cable connection between the input field and the protective field is quite complex and also often a source of failure as a result thereof. Moreover, the monitoring of the great number of cables is also difficult to handle. In summary, this means that the erection of such a high or medium voltage installation involves considerable expense not only during mounting but also during monitoring and that not all the failure sources can be eliminated.

BRIEF SUMMARY OF THE INVENTION

It is therefore an object of the invention to remedy the high-cost erection, mounting, and monitoring problems associated with cabling between the input fields and protective fields of high and medium voltage installations. More specifically, it intends to remove the need for separate blocks with respective terminal and pole functions, and thereby make wiring more manageable and limit the possibilities of failure as a result thereof. Additionally, by combining the functions of two separate blocks into one and providing the capability of mounting on a rail located for example at the rear of the electrical panel into which such devices are installed the invention will allow the user to save a significant portion of space in the panel and thereby provide more space for the installation of other devices, if desired. Considering these benefits together, the invention saves users a significant amount of installation and operating costs by reducing the need for wiring and providing more space for other devices.

This problem is solved in accordance with the invention by a combined terminal and pole block located in the input field of the high or medium voltage installation, said block being connected in the protective field to the protective, measuring or metering device, said terminal and pole block comprising several terminal and pole segments disposed behind each other, one terminal and pole segment comprising on its upper side a pole opening for receiving the pole blade of a plug, each terminal and pole segment of each side comprising a cable clamping apparatus, said cable clamping apparatus being accessible through an opening for the cable disposed in the side wall of the terminal and pole segment. The invention is mainly directed to providing a combined terminal and pole block. According to prior art as cited in DE 10 2005 025 108, there was provided for a pole block also comprising cable clamps, but these cable clamps did not provide any pull relief due to their arrangement and configuration. This is due to the fact that, when a cable is being pulled, which is connected to a pole segment of a pole block of the type known from DE 10 2005 025 108, a torque is always exerted onto the spring loaded blades in the pole openings of the pole block. This is undesirable since, when the contact strips no longer act onto the pole blades of the plug with the required force, a permanent electrical connection for testing a utility protective relay for example might not be maintained. By connecting the cables laterally to the respective terminal and pole segment in accordance with the invention, this risk does not arise with the invention, i.e., each terminal and pole segment is capable of taking certain tensile loads without transmitting the corresponding forces to the contact blades.

Preferred features and embodiments will become apparent from the dependent claims.

There is more specifically provided that in the region of the pole openings there are provided two resiliently adjacent contact blades, each of said contact blades being more specifically loaded by a spring to allow for intimate contact with the pole blade of the plug.

The centrally important object of the invention is the cable clamping apparatus located on either side of each terminal and pole block, said cable clamping apparatus, when implemented in the invention, allows for the attaching of cables in such a way that any tensile forces on the cable will be absorbed by the terminal and pole segment and block housing and will therefore not transmit the corresponding forces to the contact blades. The cable clamping apparatus comprises a pin that is adjustable parallel to its longitudinal axis and cooperates with a counter block. The counter block, which communicates in particular with the respective contact blade, is fixed in the casing of the terminal and pole segment, in particular in the direction of the opening for the cable, meaning it is immovably housed in the casing of the segment. When the pin, which is configured to be a threaded pin, comes into contact with the counter block, this being the case when a cable is retained on the counter block by the pin, tensile forces generated by this contact will be taken by the counter block and be transferred via the casing of the segment and finally also of the pole block onto the rail on which the pole block is seated. There is further provided that the pin possesses a clamping clip for fixing the cable onto the counter block. There is a possibility for the cable to have annular cable shoes at its end, and the pin, which may be configured to be a threaded bolt, to be adjusted to project through the center of the ring into a corresponding hole in the counter block. As a result, a positive kicking connection is achieved between the cable and the clamping apparatus. A self-adhering connection occurs when the clamping clip then presses down onto the cable connector or exposed cable end which is resting on the counter block. By combining locking and pressure connections, this clamping apparatus prevents any movement of the cable shoes significant enough to have any effect on electricity that may pass from the cable through the cable clamping apparatus to the contact blades.

The invention will be discussed in closer detail herein after by way of example with reference to the attached drawings.

DETAILED DESCRIPTION OF THE INVENTION

Figure 1:
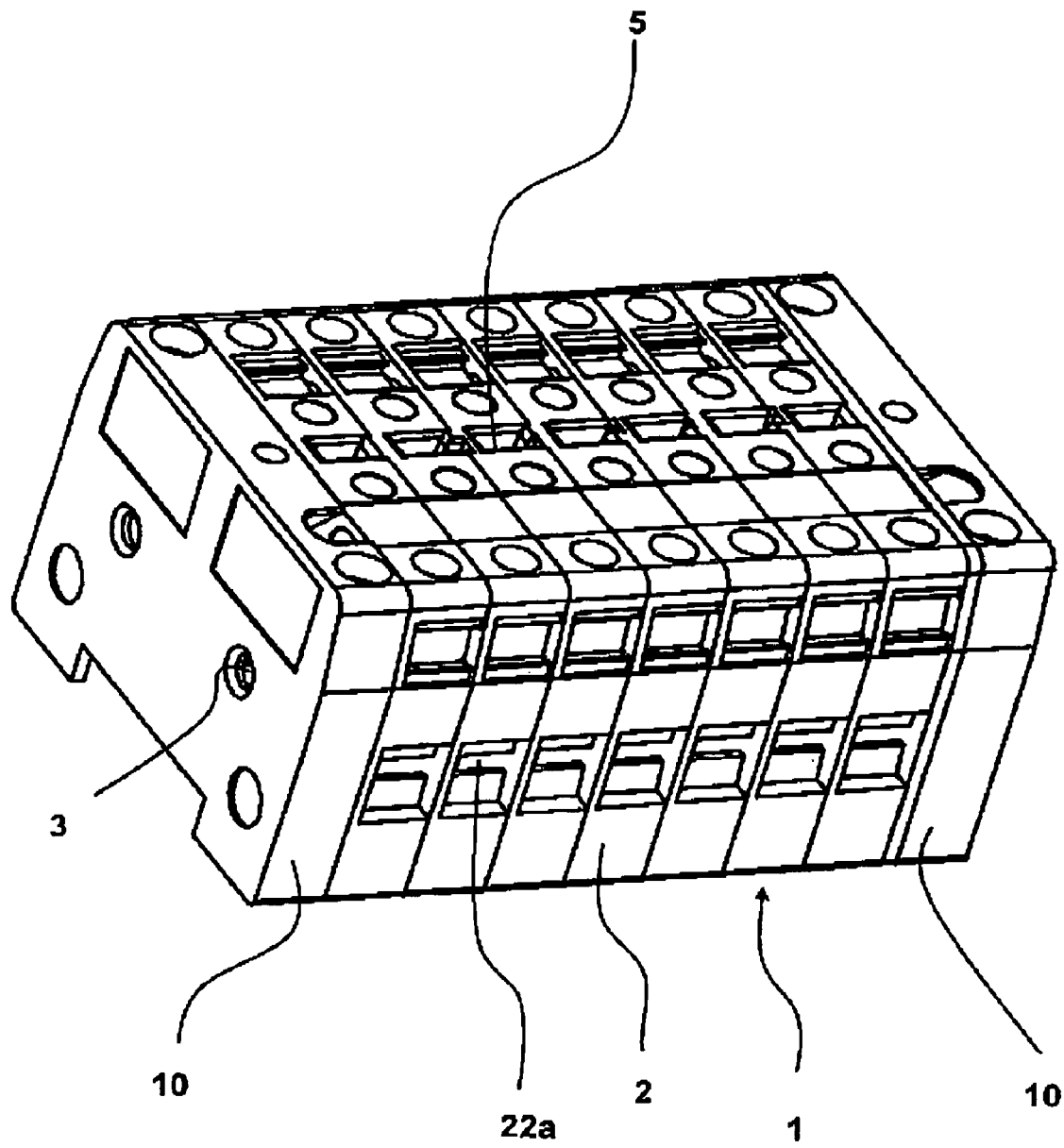
FIG. 1 shows the terminal and pole block in a perspective view.
Figure 2:
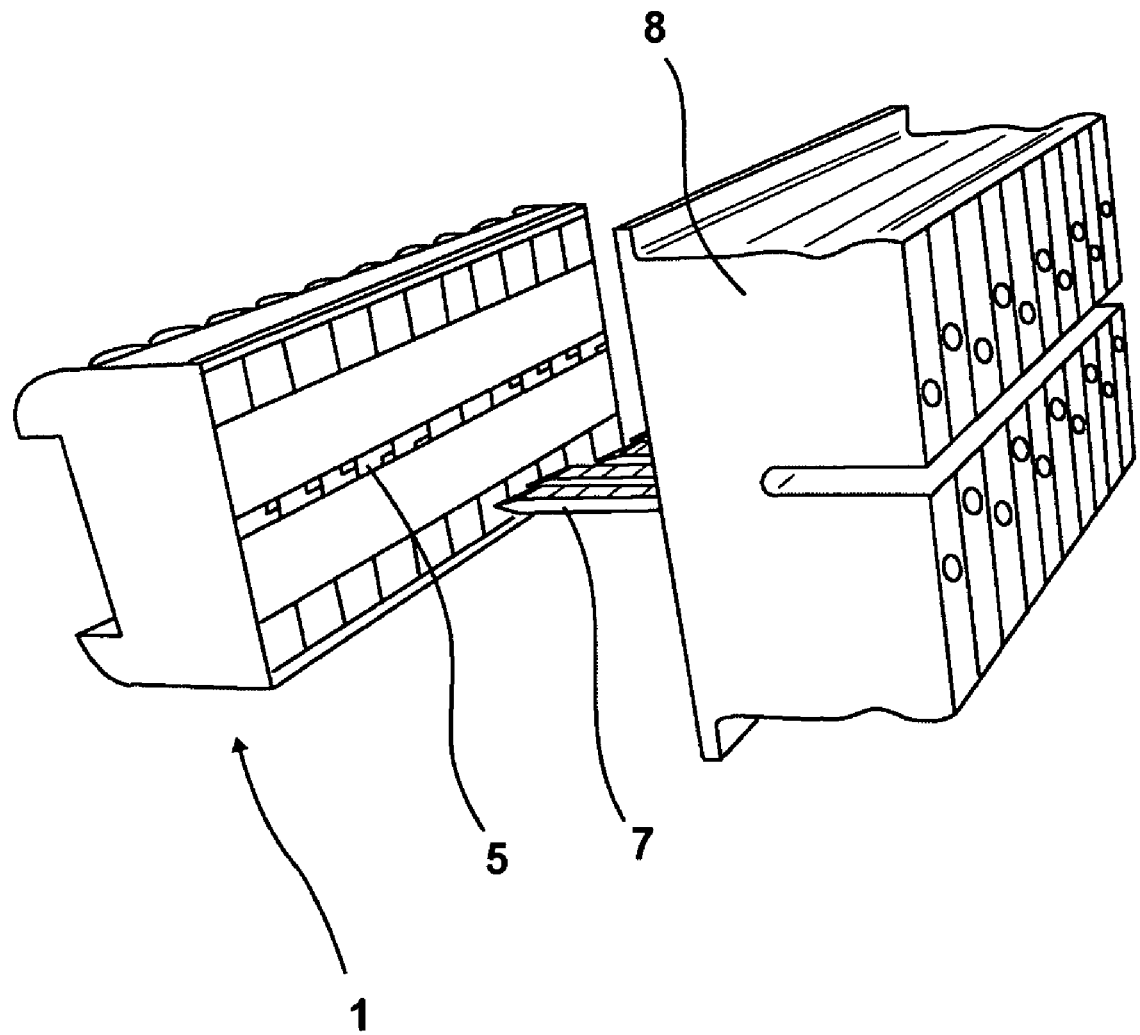
FIG. 2 shows the terminal and pole block according to FIG. 1, also in a perspective view as well as the pole plug for plugging onto the terminal and pole block.

According to FIG. 1, the particular terminal and pole block shown therein and indicated at 1 consists in all of seven terminal and pole segments 2. The terminal and pole segments 2 are joined together by screws (not shown) that project through the holes 3. At the end of the terminal and pole block there are located head segments 10 that will be discussed herein after. The terminal and pole block indicated at 1 has on its upper side pole openings 5 serving to accommodate the pole blades 7 of a pole plug indicated at 8 (FIG. 2). The pole plug 81 and pole block 1, serves for example to bypass a utility protective relay, or to connect checking devices for checking this utility protective relay to which the terminal and pole block 1 is connected. This has already been discussed above.

Figure 3:
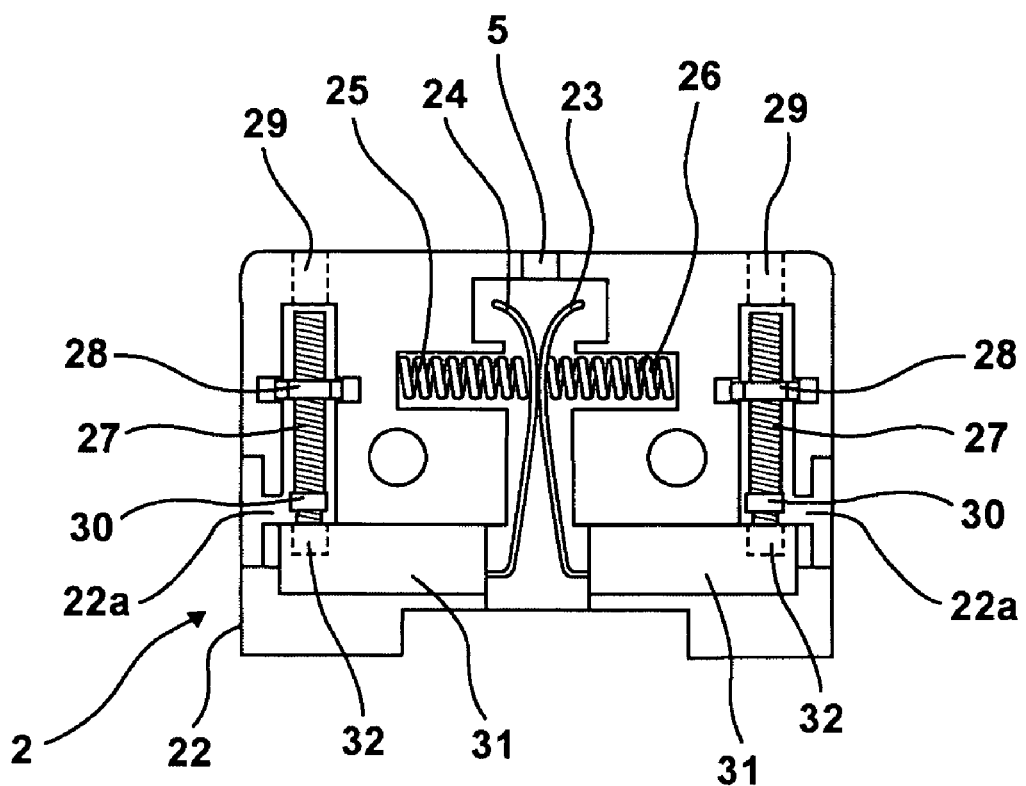
FIG. 3 shows a terminal and pole segment of the terminal and pole block.

The actual object of the invention is the configuration of the terminal and pole segments 2 as shown in FIG. 3. The terminal and pole segment 2 shown in FIG. 3 has a housing 22, two contact blades 23 and 24 being provided in the housing 22. Each contact blade is loaded by a respective spring 25, 26 as is obvious from FIG. 3. Moreover, the housing includes on either side a rotatable pin 27 that is configured like a threaded pin. The rotatable pin 27 is carried in a threaded nut 28 that is non-rotatable and immovably disposed in the housing 22, the upper end of the threaded pin 27 being accessible for a screwdriver through an opening 29 in the housing 22. At the lower end, the threaded pin has a clamping clip 30. The counter block 31 is disposed beneath the threaded pin 27 in the housing 22. The counter block 31 has a hole 32 in the region of the threaded pin 27; the hole 32 may be provided with an internal thread. The counter block is immovably fixed in the housing of the terminal and pole segment.

There exist at least two different types of cable connectors; an annular terminal is known in particular and can be fixed to the counter block 31 by the threaded pin 27 which projects through the ring opening of the annular terminal and into the hole 32 thus realizing a positive lacking connection the cable. On cables in which the wires are unprotected, the clamping dip 30 is used to connect the cable to the counter block 31, insofar as this clamping clip presses the cable down onto the counter block; the threaded pin 27 hereby also projects into the hole 32 in the counter block 31. This results in a self-adhering connection between the counter block and the threaded bolt or the clamping clip on the one side and the cable on the other side which can only be inserted laterally, into the opening 22a in the housing 22 of the terminal and pole segment 2. This is important since the cable cannot exert any torque on the contact blades 23 and 24 when pulled. This means that the pull from the cable is relieved, whereas the prior art provides for this purpose—as already described herein above—a completely separate terminal block.

Figure 4:
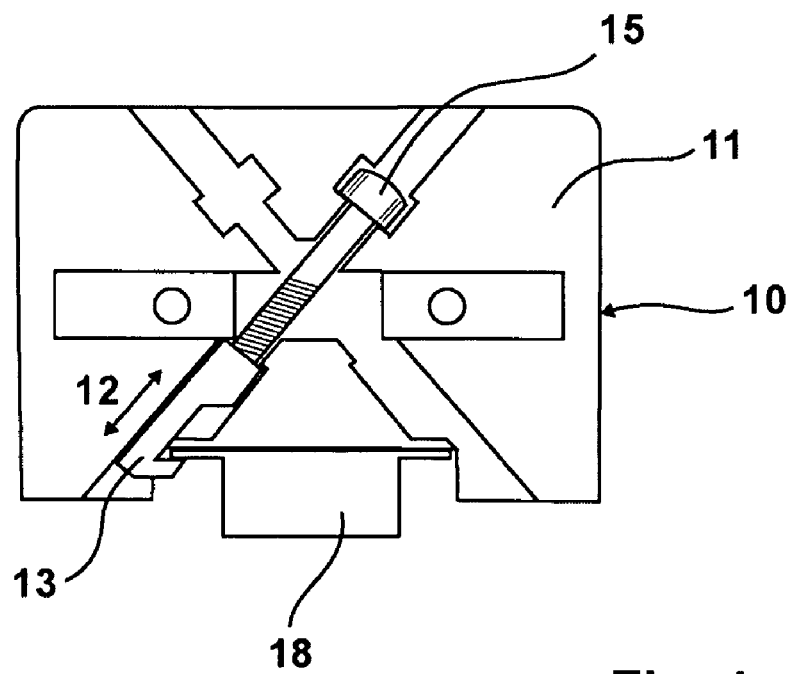
FIG. 4 shows the head segment in a side view.

As already explained herein above, the terminal and pole block has one head segment 10 on either side (FIG. 4). This head segment 10 comprises a housing 11, the housing 11 comprising a clamping claw 13 that is slidable in the direction of the arrow 12 in FIG. 4. The threaded bolt 15 is provided for displacing the clamping claw 13. By displacing the clamping claw 13 pursuant to arrow 12, it is possible to releasably fasten the terminal and pole block onto a rail 18.

I claim:

1. An apparatus for testing a protective, measuring, or metering device as a constituent part of a voltage installation, namely, a utility protective relay, a generator protective device, a current meter or other protective, measuring, or metering electrical devices in a voltage installation, characterized by a combined terminal and pole block (1) comprising several terminal and pole segments (2) disposed behind each other, each terminal and pole segment (2) comprising on its upper side a pole opening (5) for receiving a pole blade (7) of a plug (8), each terminal and pole segment (2) having a cable clamping apparatus (27; 28; 30; 31; 32) including a counter block (31) having a long side and a short side on either side thereof and including a pin (27) that is adjustable parallel to its longitudinal axis and that cooperates with said counter block (31); said cable clamping apparatus (27; 28; 30; 31; 32) being accessible through an opening (22a) disposed in the side wall of the terminal and pole segment (2) and able to be adjusted to accept and secure a cable inserted laterally, in the direction of the counter block's (31) longest side; said apparatus being constructed and arranged so that it is able to withstand tensile forces from cabling attached to said cable clamping apparatuses (27; 28; 30; 31; 32) without degradation of series terminal and pole block functions, therefore allowing it to be connected to tensile cabling of the voltage installation on the one side and connected to the protective, measuring or metering device on the other side, and thereby to serve both terminal block cable-pull relief functions and pole block device testing functions safely and accurately, and consequently reducing wiring and cost requirements and associated electrical-failures in the voltage installations.

2. The apparatus as set forth in claim 1, characterized in that two resiliently adjacent contact blades (23, 24) are provided in the region of the pole opening (5).

3. The apparatus as set forth in claim 2, characterized in that the contact blades (23, 24) are each loaded by a spring (2).

4. The apparatus as set forth in claim 1, characterized in that the pin is configured to be a threaded pin (27).

5. The apparatus as set forth in claim 4, characterized in that the counter block (31) comprises has a hole (32).

6. The apparatus as set forth in claim 1, characterized in that the pin (27) comprises a clamping clip (30) for fixing a cable on the counter block (31).

7. The apparatus as set forth in claim 1, characterized in that the counter block (31) communicates with a respective one of the contact blades (23, 24).

8. The apparatus as set forth in claim 1, characterized in that the counter block (31) is immovably fixed in the housing of the terminal and pole segment (2) and is an integral piece of the cable clamping apparatus (27; 28; 30; 31; 32) in that it is placed directly adjacent to the opening (22a) in such a way as to only allow a cable that would be connected to the terminal and pole segment (2) via the cable clamping apparatus (27; 28; 30; 31; 32) to be inserted laterally through the opening (22a), in the direction of the counter block's (31) longest side.

9. The apparatus as set forth in claim 1, characterized in that the terminal and pole block (1) comprises at either end a head segment (10), said head segment (10) comprising, for its fixation on a rail (18), an adjustable clamping claw (13) which can be displaced by adjusting a threaded bolt (15) and then sliding the clamping claw (13) in the direction of the longitudinal axis (12) of the threaded bolt (15), thereby engaging the clamping claw (13) behind a collar on the rail (18) and fixing the terminal and pole block (1) to the rail in such a way that, when combined with the cable clamping apparatus (27; 28; 30; 31; 32), allows tensile forces from attached cabling to be transferred to the plastic housing (22) and to the rail (18), thereby preventing any tensile forces from acting on the contact blades (23, 24), and limiting the possibility of electrical-failures as a result thereof in the voltage installations.

10. An apparatus for testing a protective, measuring, or metering device as a constituent part of a voltage installation, namely, a utility protective relay, of a generator protective device, of a current meter or of other protective, measuring, or metering electrical devices in a voltage installation, characterized by a combined terminal and pole block (1) comprising several terminal and pole segments (2) disposed behind each other, each terminal and pole segment (2) comprising on its upper side a pole opening (5) for receiving a pole blade (7) of a plug (8), each terminal and pole segment (2) having a cable clamping apparatus (27; 28; 30; 31; 32) including a counter block (31) having a long side and a short side on either side thereof; said cable clamping apparatus (27; 28; 30; 31; 32) being accessible through an opening (22a) disposed in the side wall of the terminal and pole segment (2) and able to be adjusted to accept and secure a cable inserted laterally in the direction of the counter block's (31) longest side; said apparatus being constructed and arranged so that it is able to withstand tensile forces from cabling attached to said cable clamping apparatuses (27; 28; 30; 31; 32) without degradation of series terminal and pole block functions, therefore allowing it to be installed in the input field of the voltage installation to receive tensile cabling and communicate directly with the protective, measuring or metering device in the protective field, and thereby to serve both series terminal block cable-pull relief functions for the tensile cabling in the input field and pole block device testing functions for the protective, measuring or metering device in the protective field safely and accurately, and consequently reducing wiring and cost requirements and associated electrical-failures in the voltage installations.

* * * * *

UNITED STATES PATENT AND TRADEMARK OFFICE
CERTIFICATE OF CORRECTION

Page 1 of 1

PATENT NO.         : 7,884,597 B2
APPLICATION NO.    : 12/150405
DATED              : February 8, 2011
INVENTOR(S)        : Hubert Ostmeier It is certified that error appears in the above-identified patent and that said Letters Patent is hereby corrected as shown below:

Column 4, line 19, "81" should be --8--;

Column 4, line 45, "lacking" should be --looking--;

Column 4, line 45, after "connection" insert --with--;

Claim 5, line 40, after "block (31)" delete "comprises".

Signed and Sealed this
Fifth Day of July, 2011

David J. Kappos
*Director of the United States Patent and Trademark Office*